United States Patent
Pergande et al.

(10) Patent No.: US 10,903,096 B2
(45) Date of Patent: Jan. 26, 2021

(54) SYSTEM AND APPARATUS FOR PROCESS CHAMBER WINDOW COOLING

(71) Applicant: Varian Semiconductor Equipment Associates, Inc., Gloucester, MA (US)

(72) Inventors: Paul E. Pergande, Austin, TX (US); James D. Strassner, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 231 days.

(21) Appl. No.: 16/026,640

(22) Filed: Jul. 3, 2018

(65) Prior Publication Data
US 2019/0311922 A1    Oct. 10, 2019

Related U.S. Application Data

(60) Provisional application No. 62/654,281, filed on Apr. 6, 2018.

(51) Int. Cl.
*H05B 1/02* (2006.01)
*H05B 3/00* (2006.01)
(Continued)

(52) U.S. Cl.
CPC .......... *H01L 21/67115* (2013.01); *G02B 1/11* (2013.01); *G02B 5/006* (2013.01); *H01L 21/67248* (2013.01)

(58) Field of Classification Search
CPC ................ H05B 1/0233; H05B 3/0047; H01L 21/67248; C23C 16/411; C23C 16/488; C23C 16/4411; C23C 16/4488
See application file for complete search history.

(56) References Cited

U.S. PATENT DOCUMENTS

| 4,858,557 A | * | 8/1989 | Pozzetti | C23C 16/4411 |
| | | | | 118/725 |
| 5,779,848 A | * | 7/1998 | Aruga | C23C 16/488 |
| | | | | 156/345.37 |

(Continued)

FOREIGN PATENT DOCUMENTS

| JP | 2006019583 A | 1/2006 |
| KR | 20020089231 A | 11/2002 |

OTHER PUBLICATIONS

English translation of KR 10-2002-0089231 to Nam, published 2003 (Year: 2003).*

(Continued)

*Primary Examiner* — Michael A Laflame, Jr.
(74) *Attorney, Agent, or Firm* — Kacvinsky Daisak Bluni PLLC (57) ABSTRACT

Provided herein are approaches for cooling a process chamber window. In some embodiments, a system for process chamber window cooling may include a process chamber for processing a wafer, wherein the process chamber includes a window. In some embodiments, the window allows light from a lamp assembly to be delivered to the wafer. The system further includes a cooling apparatus operable with the process chamber, the cooling apparatus for delivering a gas to the window. The cooling apparatus includes a support ring supporting the window. The support ring includes a perimeter wall, and a plurality of slots formed through the perimeter wall. The plurality of slots may deliver a gas (e.g., air) across the window.

20 Claims, 8 Drawing Sheets

(51) Int. Cl.
*H01L 21/67* (2006.01)
*G02B 5/00* (2006.01)
*G02B 1/11* (2015.01)

(56) References Cited

U.S. PATENT DOCUMENTS

| | | |
|---|---|---|
| 8,455,849 B2 | 6/2013 | Baluja et al. |
| 9,412,671 B1* | 8/2016 | Tsai ............... H01L 21/324 |
| 9,437,400 B2 | 9/2016 | Setton et al. |
| 9,653,340 B2* | 5/2017 | Boguslavskiy ......... C23C 16/46 |
| 2005/0183826 A1* | 8/2005 | Choi .................. H01J 37/3244 |
| | | 156/345.34 |
| 2010/0083898 A1* | 4/2010 | Kogura ............ H01L 21/31641 |
| | | 118/692 |
| 2010/0230387 A1* | 9/2010 | Okesaku .......... H01J 37/32449 |
| | | 216/69 |
| 2011/0018118 A1 | 1/2011 | Hsieh et al. |
| 2015/0069043 A1* | 3/2015 | Francischetti .... H01L 21/67103 |
| | | 219/444.1 |
| 2015/0214083 A1* | 7/2015 | Kawakami ........ H01L 21/67248 |
| | | 156/345.27 |
| 2016/0013079 A1* | 1/2016 | Choi .................. H01L 21/6708 |
| | | 156/345.21 |
| 2017/0294318 A1* | 10/2017 | Yoshida ................ C23C 16/345 |
| 2019/0127851 A1* | 5/2019 | Lau .................. H01L 21/67248 |
| 2019/0276938 A1* | 9/2019 | Sugishita ............... H01L 21/02 |

OTHER PUBLICATIONS

International Search Report and Written Opinion dated Oct. 28, 2019 for PCT/US2019/024635 filed Mar. 28, 2019.

\* cited by examiner

SYSTEM AND APPARATUS FOR PROCESS CHAMBER WINDOW COOLING

CROSS-REFERENCE TO RELATED APPLICATIONS

This application claims priority to U.S. provisional patent application Ser. No. 62/654,281, filed Apr. 6, 2018, the entire contents of which is incorporated by reference herein.

FIELD OF THE DISCLOSURE

The present embodiments relate to process chamber windows, and more particularly, to a system and apparatus for providing cooling of process chamber windows.

BACKGROUND OF THE DISCLOSURE

Lamp heaters used with process chambers project light from a lamp array through a window onto a wafer being heated. The window absorbs some of the light and converts light energy into temperature increase in the window. Over repeated lamp cycles, the window temperature continues to increase, and radiates energy into the wafer being heated. The window is not part of the control loop and therefore becomes problematic because the window can heat to over 300 C at a distance approximately 1 inch away from the wafer, which generally are not to be heated above 150 C. After repeated cycles, the window temperature can overheat the wafer.

SUMMARY OF THE DISCLOSURE

In one embodiment, a system for process chamber window cooling may include a process chamber for processing a wafer, wherein the process chamber includes a window. The system may further include a cooling apparatus operable with the process chamber, the cooling apparatus for delivering a gas to the window. The cooling apparatus may include a support ring supporting the window. The support ring may include a perimeter wall, and a plurality of slots formed through the perimeter wall, the plurality of slots for delivering a gas across the window.

In another embodiment, a system for process chamber window cooling may include a process chamber for processing a wafer, the process chamber including a window. The system may further include a cooling apparatus operable with the process chamber, the cooling apparatus for delivering an airflow to the window. The cooling apparatus may include a support ring supporting the window, wherein the support ring includes a perimeter wall, and a plurality of slots formed through the perimeter wall, the plurality of slots delivering the airflow across an exterior surface of the window.

In another embodiment, a cooling apparatus operable with a process chamber may include a support ring supporting a window of the process chamber. The support ring may include a plurality of slots formed through a perimeter wall, the plurality of slots delivering the airflow across the window. The cooling apparatus may further include a main duct for delivering the gas to the support ring.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

A system and apparatus in accordance with the present disclosure will now be described more fully hereinafter with reference to the accompanying drawings, where embodiments of the methods are shown. The system and apparatus may be embodied in many different forms and are not to be construed as being limited to the embodiments set forth herein. Instead, these embodiments are provided so the disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on. In one embodiment, the reference parameter may be degree value, such as 180°. Deviations +−180° (e.g., an amount of less than 1%, less than 3%, less than 5%) may still be considered functionally equivalent to exactly 180°.

As further described herein, provided are approaches for cooling a process chamber window. In some embodiments, a system for process chamber window cooling may include a process chamber for processing a wafer, such as a semiconductor wafer, wherein the process chamber includes a window. In some embodiments, the window allows light from a lamp assembly to be delivered to the wafer. The system further includes a cooling apparatus operable with the process chamber, the cooling apparatus for delivering a gas to the window. The cooling apparatus includes a support ring coupled with and supporting the window. The support ring includes a perimeter wall, and a plurality of slots formed through the perimeter wall. The plurality of slots may deliver a gas (e.g., air) across the window to lower the temperature of the window.

Figure 1:
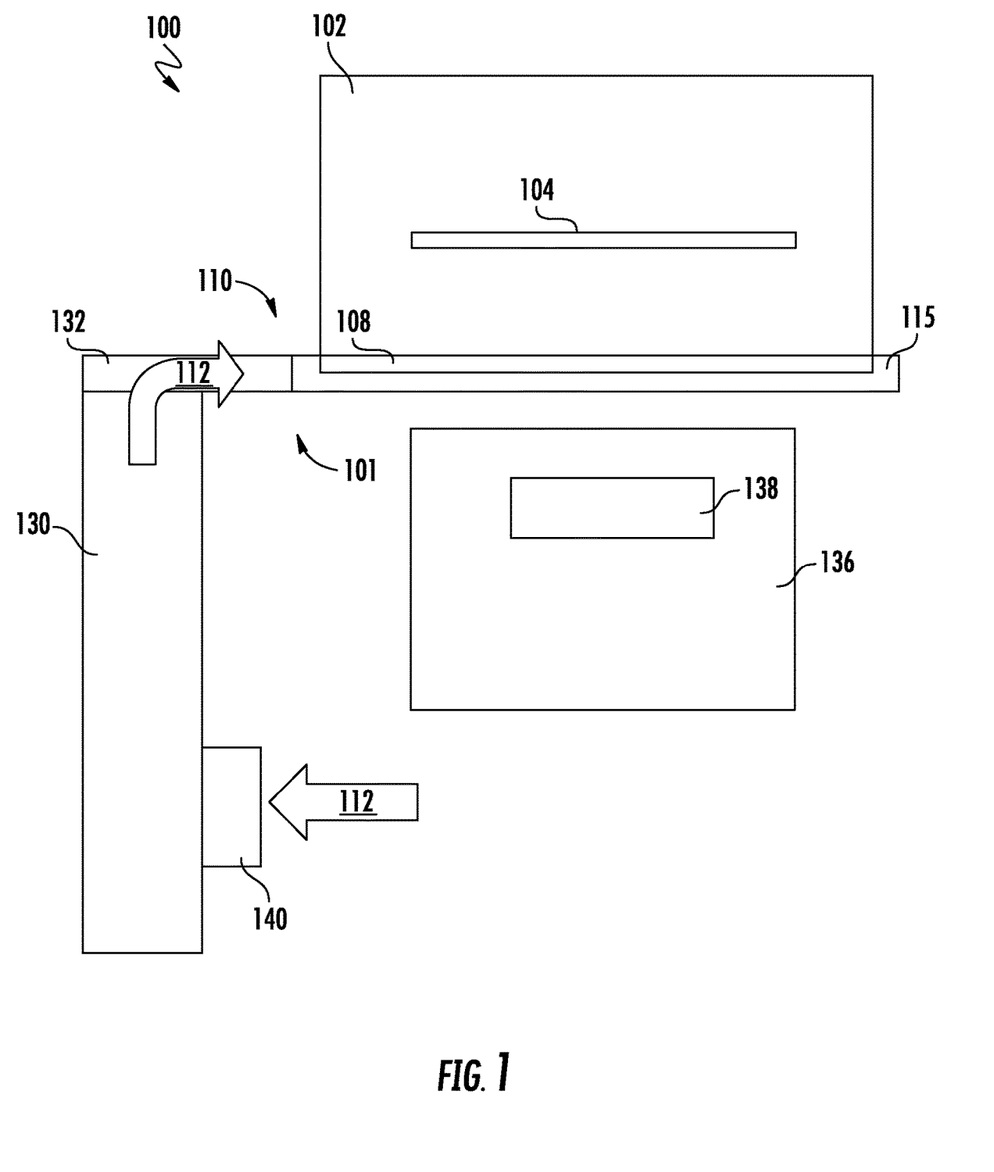
FIG. 1 depicts a system for process chamber window cooling according to embodiments of the present disclosure.
Figure 2:
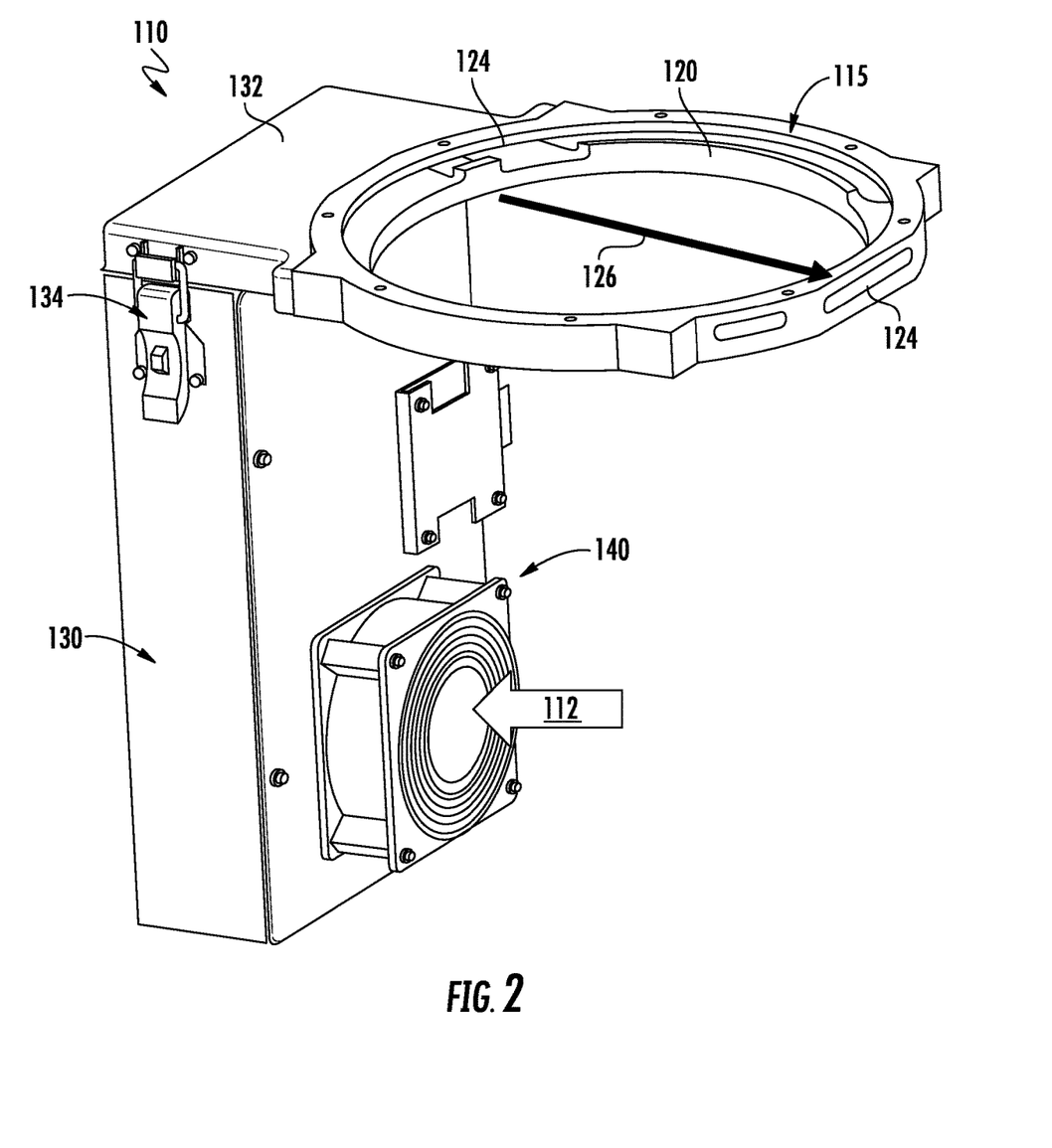
FIG. 2 depicts a cooling apparatus of the system of FIG. 1 for process chamber window cooling.

Turning now to FIGS. 1-2, there is shown a system 100 and cooling apparatus 101 for process chamber window cooling according to embodiments of the disclosure. As shown, the system 100 may include a process chamber 102 for processing a wafer 104, the process chamber 102 including a window 108. The window 108 may be a polished transparent or translucent piece of quartz. The window 108 may be different material in different embodiments.

The system 100 further includes a cooling apparatus 110 operable with the process chamber 102. The cooling apparatus 110 is operable to deliver a gas 112 to the window 108. In exemplary embodiments, the cooling apparatus 110 includes a support ring 115 coupled to and supporting the window 108. The support ring 115 may include a perimeter wall 120 extending around a perimeter of the window 108. Although the support ring 115 and the window 108 are both generally circular, embodiments herein are not limited to any particular shape. The support ring 115 may include a plurality of slots 124 formed through the perimeter wall 120 to deliver the gas 112 across the window 108, for example, in the direction shown by arrow 126 (FIG. 2). In some embodiments, the gas 112 is delivered across the window 108 in a direction parallel to, or approximately parallel to, the window 108. The gas 112 may be delivered along a same side of the window 108, e.g., the exterior side of the window 108 facing a lamp assembly 136.

As shown, the cooling apparatus 101 may further include a main duct 130 for delivering the gas 112 to the support ring 115. In some embodiments, the main duct 130 may be a plenum. Coupled to the main duct 130 may be an inlet duct 132, the inlet 132 duct directly physically coupled to the support ring 115. The main duct 130 and the inlet duct 132 are fluidly connected to permit air to flow therethrough. In some embodiments, the main duct 130 and the inlet duct 132 may be one continuous component. As shown in FIG. 2, the inlet duct 132 may be releasably coupled to the main duct 130, for example, by clamp/clasp/latch 134.

The system 100 may include the lamp assembly 136 (FIG. 1) adjacent the window 108 and the support ring 115. The lamp assembly 136 includes a lamp 138 for providing light to the wafer 104. The system may further include a fan 140 for delivering the gas 112 to the cooling apparatus 101. As shown in FIG. 2, the fan 140 may be directly or integrally coupled to the main duct 130. Embodiments herein are not limited, however.

Figure 3A:
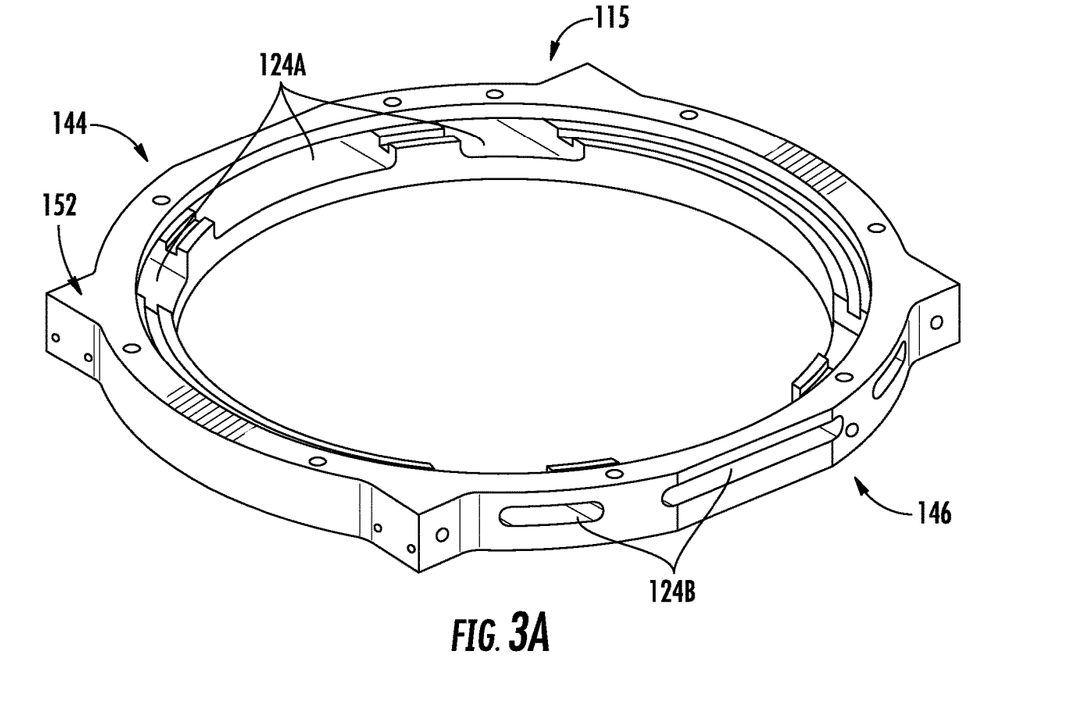
FIG. 3A is a perspective views illustrating a support ring of the cooling apparatus of FIG. 2 according to embodiments of the present disclosure.
Figure 3B:
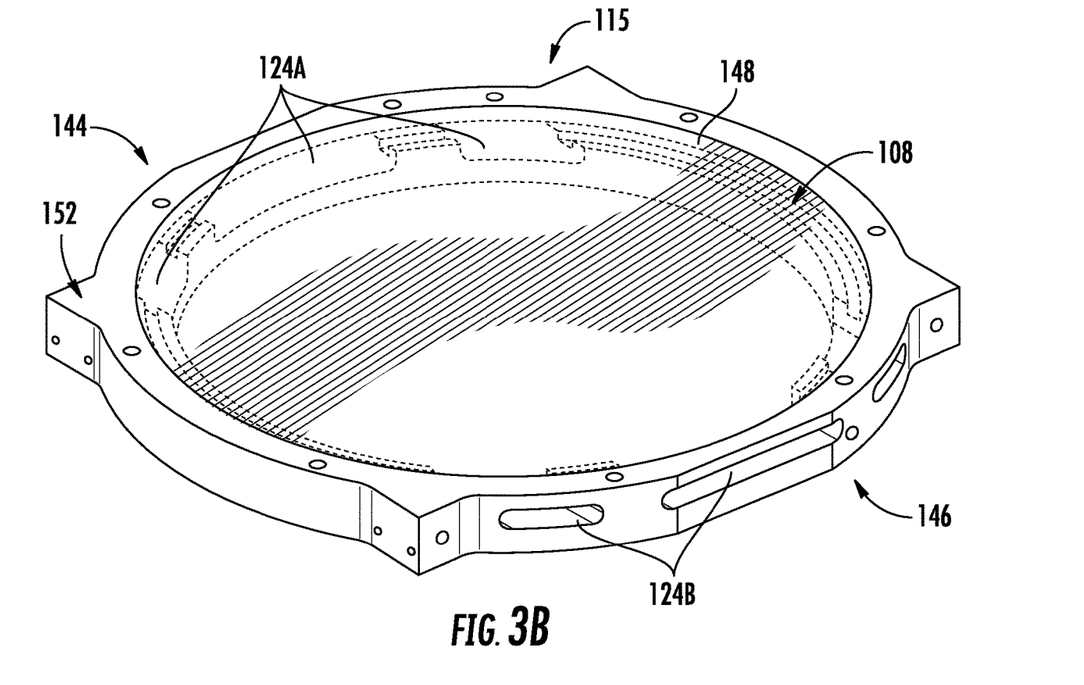
FIG. 3B is perspective views illustrating the support ring of the cooling apparatus of FIG. 3A including a window according to embodiments of the present disclosure.

Turning now to FIGS. 3A-3B, the support ring 115 according to embodiments of the disclosure will be described in greater detail. FIG. 3A shows the support ring 115 without the window, whereas FIG. 3B includes the window 108. In exemplary embodiments, a first set of slots 124A of the plurality of slots of the support ring 115 is disposed on a first side 144 of the window 108. A second set of slots 124B of the plurality of slots of the support ring 115 is disposed on a second side 146 of the window 108. In non-limiting embodiments, the first set of slots 124A and the second set of slots 124B are positioned approximately 180 degrees apart on circumferentially opposite sides of the support ring 115.

In some embodiments, the window 108 includes an anti-reflective (AR) optical coating 148. The AR optical coating 148 improves transmission through the window 108 from approximately 88-90% transmission to approximately 98% transmission. The transmission improvement allows the heater to be operated at lower power levels, thus saving operating expense for the user, and allows the lamp to respond faster, improving throughput by a similar 10% proportion.

In some embodiments, the AR optical coating 148 is applied to just the exterior/lamp side of the window. In some embodiments, the AR optical coating 148 is applied to both sides (e.g., lamp side and side facing interior of process chamber) of the window for even higher transmission. In yet other embodiments, the AR optical coating 148 is able to survive the light flux from the lamp. For example, the AR optical coating 148 is able to survive the approximately 250-300 C environment the ring 115 operates in. The AR optical coating 148 allows for more efficient energy transfer between the lamps and the wafer. The improved efficiency can advantageously be monetized by increasing throughput, stabilizing a low temperature process, and reducing energy costs to operate the tool.

Figure 4A:
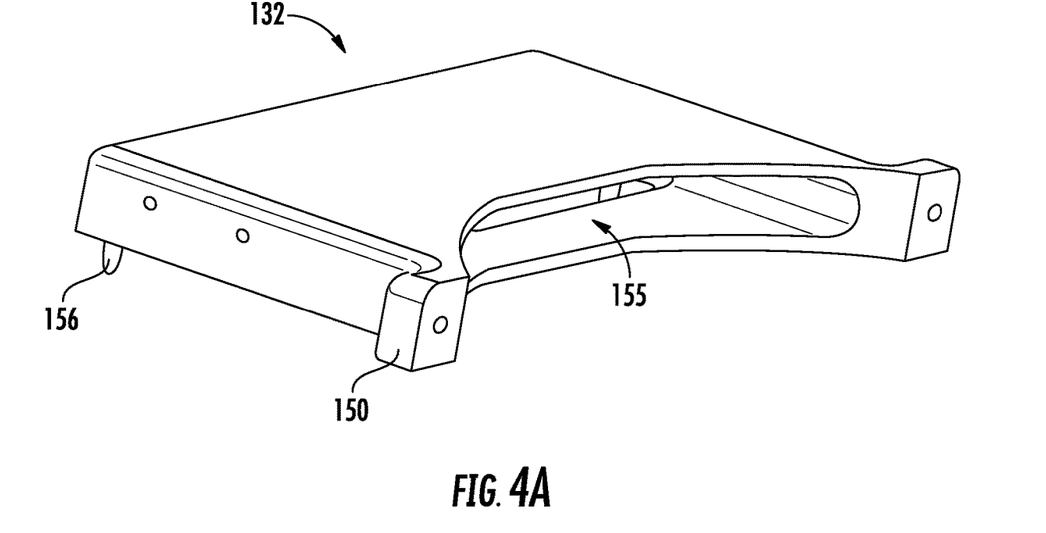
FIGS. 4A-4B are perspective views illustrating an inlet duct of the cooling apparatus of FIG. 2 according to embodiments of the present disclosure.
Figure 4B:
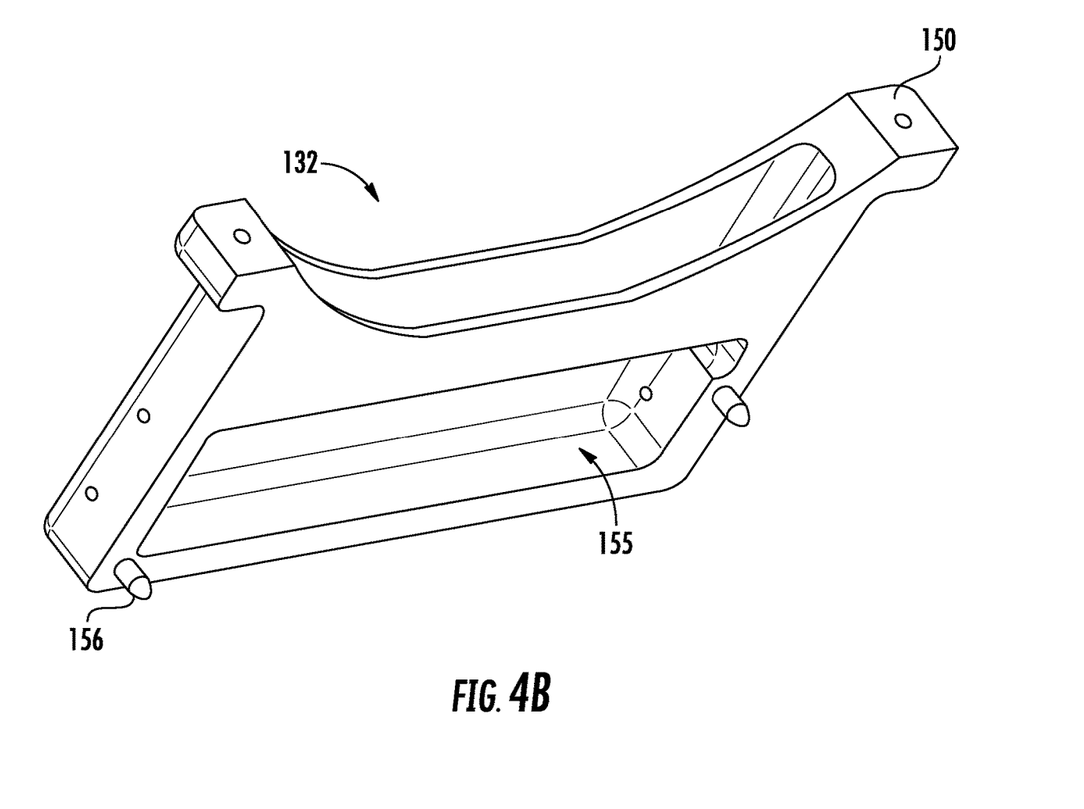

FIGS. 4A-4B show the inlet duct 132 according to embodiments of the disclosure. The inlet duct 132 is configured to be directly physically coupled to the support ring 115. In some embodiments, a set of tabs 150 may engage with a set of corresponding bump-outs 152 (FIGS. 3A-3B) of the support ring 115. Any variety of fasteners (e.g., bolts, screws, etc.) may be used to secure the set of tabs 150 with the bump-outs 152. The inlet duct 132 may include an interior chamber 155 for delivering the gas 112 to the support ring 115. In some embodiments, the inlet duct 132 includes a set of pins 156 for engaging the main duct 130.

Figure 5:
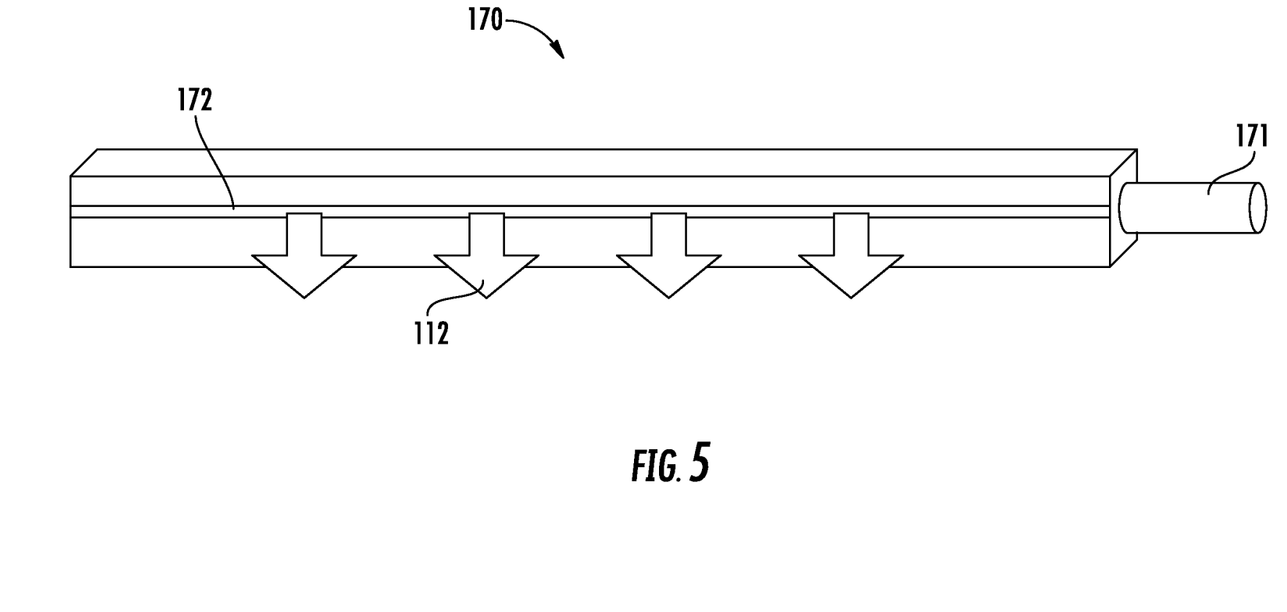
FIG. 5 demonstrates a gas delivery apparatus according to embodiments of the present disclosure.

Turning now to FIG. 5, a gas delivery apparatus 170 for delivering gas to the support ring 115 according to embodiments of the present disclosure will be described. As shown, the gas delivery apparatus 170 may include an inlet 171 for receiving the gas, and an exhaust slot 172 for delivering the gas 112 towards the support ring 115. In some embodiments, the gas delivery apparatus 170 provides an airflow to the window 108 in a knife-like shape/configuration. The gas delivery apparatus 170 is a high efficiency air amplifier designed to entrain more air into the cooling jet than the compressed air fed to the device. For example, the gas delivery apparatus 170 may entrain 5-10 times more air than consumed, allowing for more efficient cooling of the window and minimal impact to the operation of the tool. Cooling the window allows more precise and repeatable wafer set points at low temperatures without an overheated window affecting the process recipes. In some embodiments, the air knife does not include a plenum to entrain air across the window.

Figure 6:
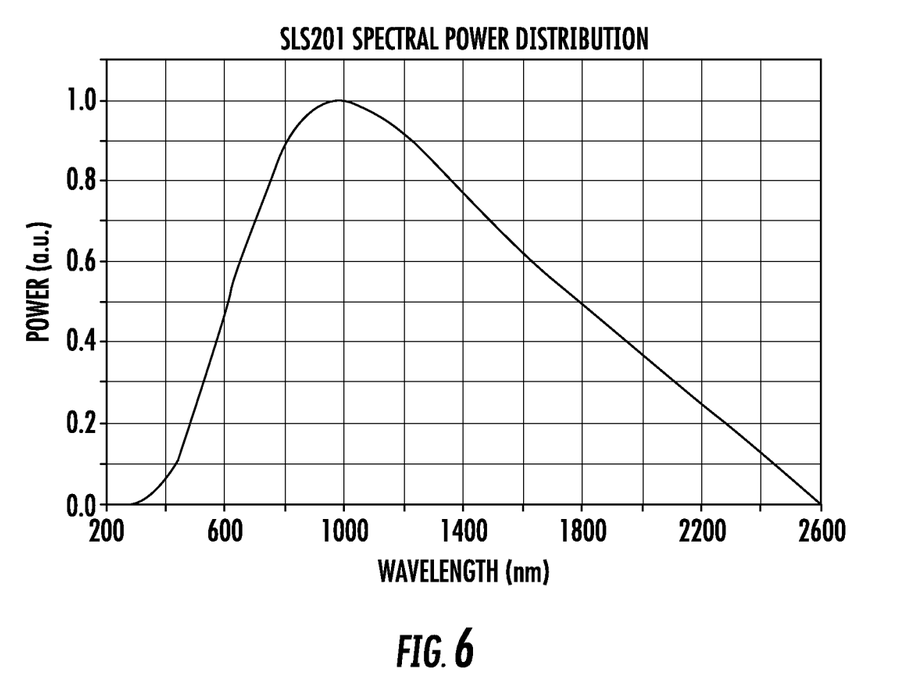
FIG. 6 shows the spectral emission and relative power from a tungsten halogen bulb used in a heater according to embodiments of the present disclosure.

FIG. 6 demonstrates tungsten halogen bulb spectral power emission. Some process chamber windows are not coated. Instead, the process chamber window is just polished quartz. FIG. 6 shows the spectral emission and relative power from a tungsten halogen bulb used in a heater. The wavelength spans from 400 nm to 2600 nm, with a peak at 1000 nm. The full width half max ranges from 600 nm to 1800 nm. An advantage results from having as much energy as possible transferred from the lamps to the wafer to optimize throughput and minimize energy consumption.

Furthermore, FIG. 6 shows the transmission curve for the quartz window. Every time light enters and exits a surface, approximately 4-5% of the energy is scattered. Adding the antireflective coating transmits light better in the spectrum having the most energy, allowing more light to be delivered into and through the window. The power lost into the window is approximately 800 W during the heating operation. AR coatings may reduce energy loss by around 80 W. Using a high-pressure blower is also beneficial because the high-pressure blower uses a plenum to capture the airflow from a high-speed fan and straighten out the flow, turning the airflow 180 degrees, and providing a uniform pressure distribution across the window. Uniform pressure correlates to uniform thermal profile of the window, which tracks directly to the response of the wafer being processed.

Figure 7:
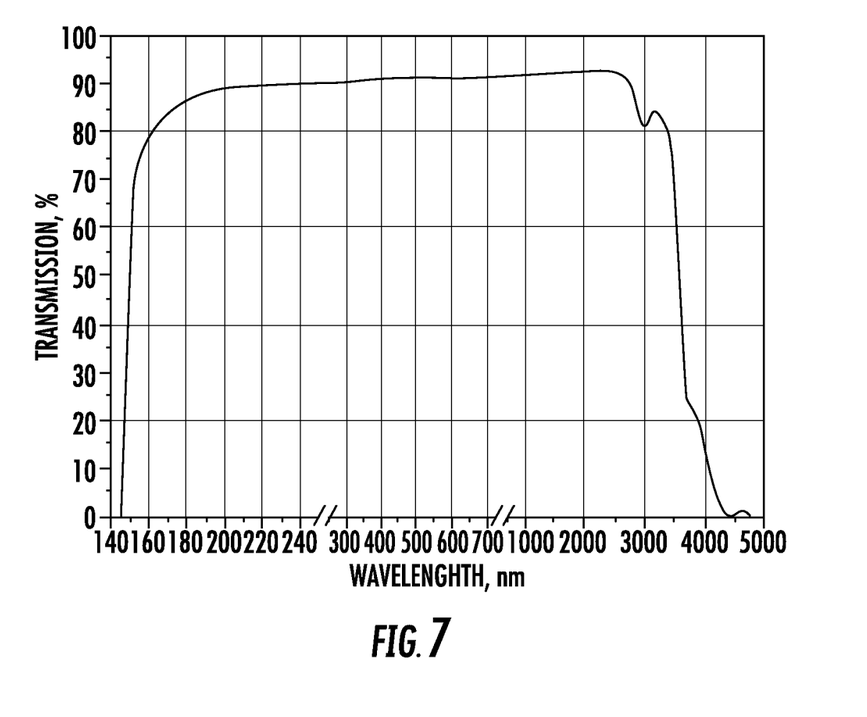
FIG. 7 demonstrates an exemplary quartz transmission for thin windows according to embodiments of the present disclosure.
Figure 8:
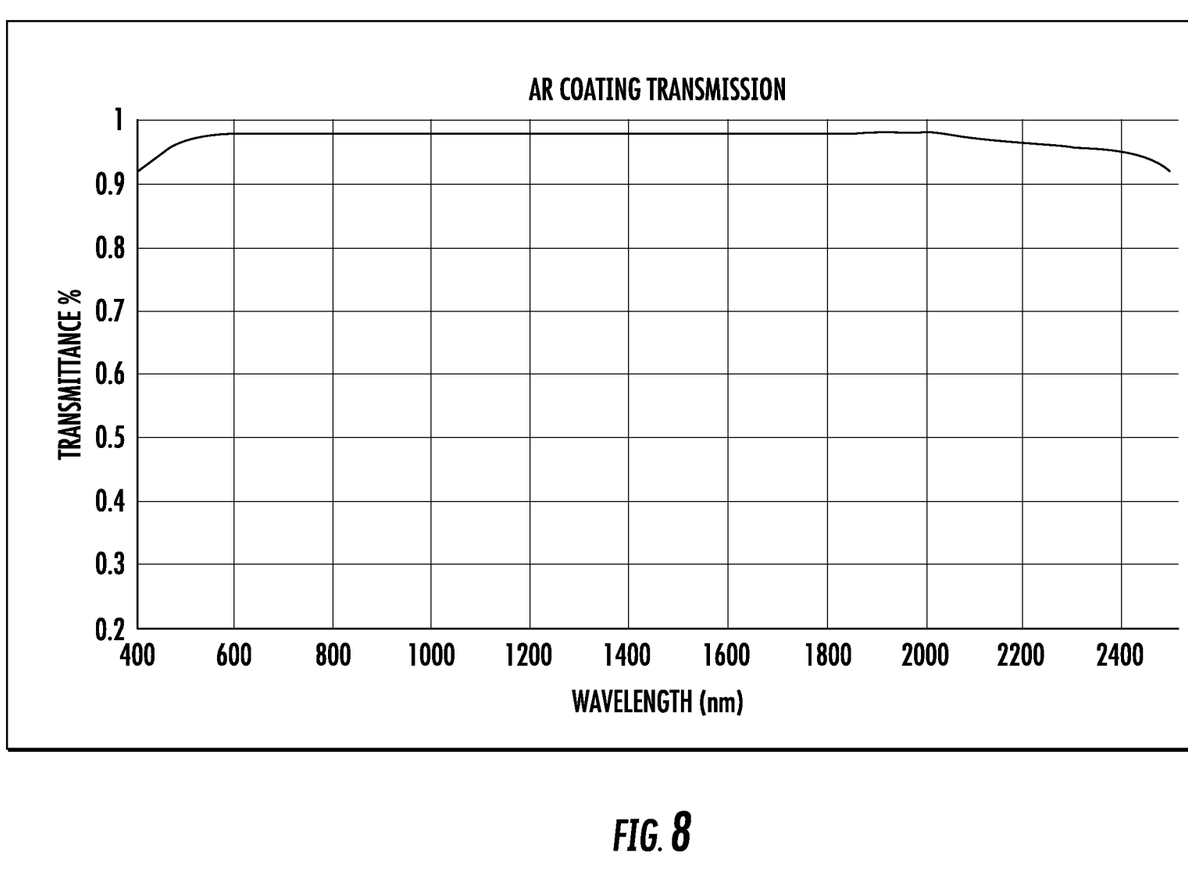
FIG. 8 demonstrates an anti-reflective quartz window transmission according to embodiments of the present disclosure.

FIG. 7 demonstrates an exemplary quartz transmission for thin windows. As shown, the transmission % is increases quickly as the wavelength increases. Between approximately 200 nm and 2500 nm, the transmission is above 90%, which allows significant heat transfer through the window. FIG. 8 demonstrates transmission % v. wavelength when the quartz window includes an anti-reflective coating. As shown, the transmission % is relatively stable even as the wavelength increases. Between approximately 400 nm and 2500 nm, the transmission is below 0.9%, which significantly decreases heat transfer through the window.

Figure 9A:
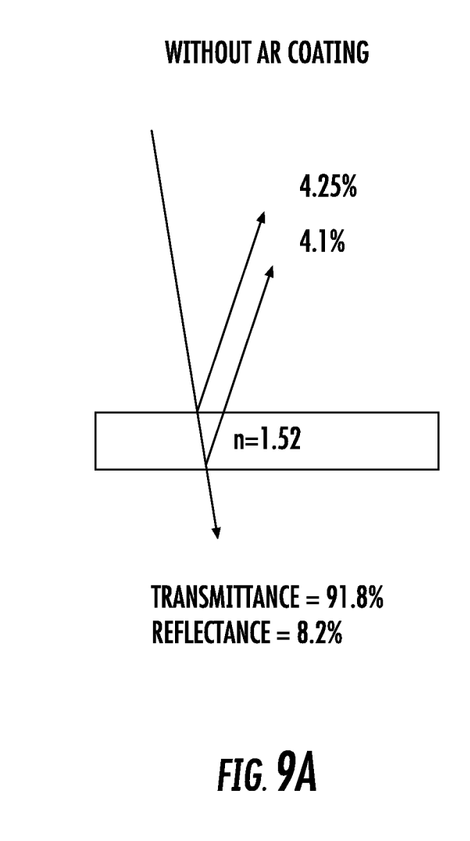
FIGS. 9A-9C demonstrate the effect of anti-reflective coatings according to embodiments of the present disclosure.
Figure 9B:
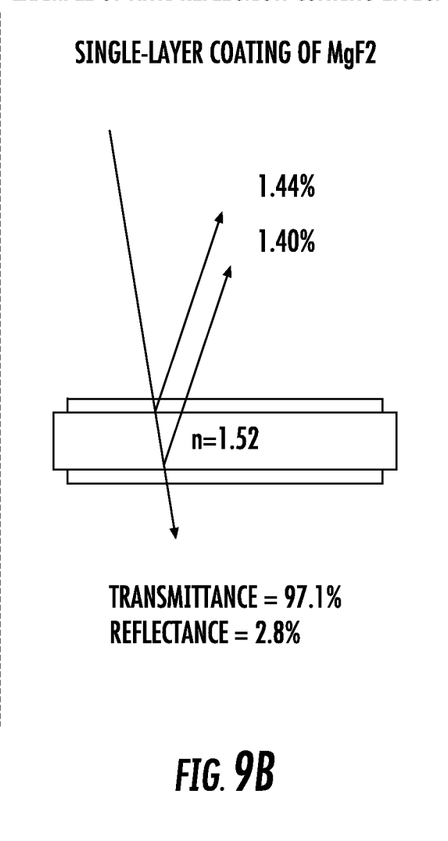
Figure 9C:
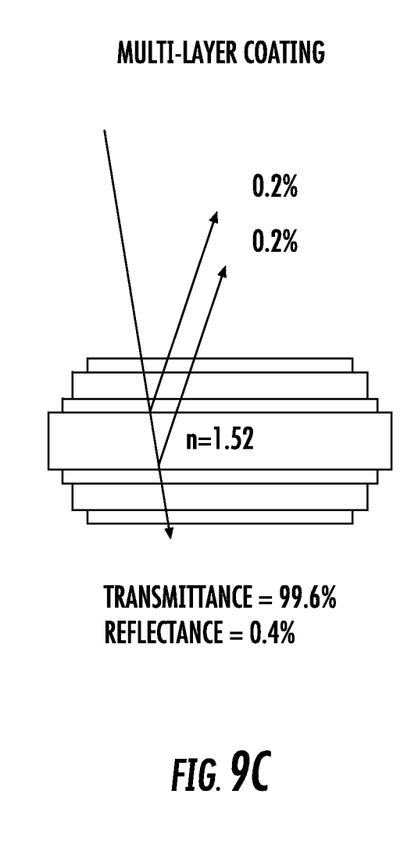

FIGS. 9A-9C demonstrate effects of anti-reflective coating. For example, FIG. 9A shows transmittance and reflection with no AR coating, FIG. 9B shows transmittance and reflection with a single-layer coating of magnesium fluoride, and FIG. 9B shows transmittance and reflection with a multi-layer coating. In some embodiments, the multi-layer coating for n=1.52 may include one or more of the following: $MgF_2$, $SiO_2$, $CeF_3$. In yet other embodiments, the multi-layer coating for n=1.6-1-8 may include $Al_2O_3$ or $Y_2O_3$, and for n~2 may include $HfO_2$, $Sc_2O_3$, $Ta_2O_5$, $Nb_2O_5$, $LaTiO_3$, $TiO_2$, or $HfO_2$, $Sc_2O_3$. As shown, as the window is coated, transmittance increases and reflection decreases.

In sum, embodiments herein provide a modified ring supporting the process chamber window by adding slots for air to flow over the atmospheric side of the process chamber window. The air may be supplied from an air knife, a device for amplifying a compressed air source and entraining additional airflow. Other embodiments use a high-pressure fan to provide the airflow across the window. A first advantageous effect of both approaches is the reduction of window temperature below 100 C, thus allowing the preheat module to operate under the control loop of the lamps. In some embodiments, the fan lowers the temperature of the window from near 300 C to below 90 C with a 70 WPH duty cycle. 90 WPH operation shows similar results, lowering window temperature from over 325 C to 90 C. A second advantageous effect attributable to the inclusion of an antireflection coating of the window is reduced heater power levels, thus saving operating expense for the user, and allowing the lamp to respond faster, improving throughput.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A system for chamber window cooling, the system comprising:
   a chamber housing a wafer, the chamber including a window, the window including a first main side facing the wafer and a second main side opposite the first main side; and
   a cooling apparatus for delivering a gas to the window, wherein the cooling apparatus comprises a support ring supporting the window, and wherein the support ring comprises:
   a perimeter wall including an interior side and an exterior side;
   a plurality of slots formed through the perimeter wall, the plurality of slots for delivering a gas across the window, wherein each of the plurality of slots extends entirely through the perimeter wall, between the interior side and the exterior side; and
   a shelf including an upper surface in direct physical contact with the second main side of the window, the shelf further including a channel recessed into the upper surface, wherein the channel is enclosed by the second main side of the window, and wherein the channel is operable to transport the gas.

2. The system according to claim 1, the cooling apparatus further comprising a main duct for delivering the gas to the support ring.

3. The system according to claim 1, the cooling apparatus further comprising an inlet duct coupled to the support ring.

4. The system according to claim 3, wherein the inlet duct is directly physically coupled to the support ring by a set of tabs of a housing, and wherein the inlet duct delivers the gas towards the plurality of slots of the support ring.

5. The system according to claim 3, wherein the inlet duct is coupled between the main duct and the support ring.

6. The system according to claim 1, further comprising a lamp assembly adjacent the window, the lamp assembly including a lamp for providing light to the wafer.

7. The system according to claim 1, further comprising a fan for delivering the gas to the cooling apparatus.

8. The system according to claim 1, wherein a first set of slots of the plurality of slots of the support ring is disposed on a first side of the window, and wherein a second set of slots of the plurality of slots of the support ring is disposed on a second side of the window.

9. The system according to claim 8, wherein the first set of slots and the second set of slots are positioned approximately 180 degrees apart.

10. The system according to claim 1, further comprising an anti-reflective optical coating on the window.

11. The system according to claim 1, wherein the window is a polished quartz.

12. A system for chamber window cooling, the system comprising:
- a chamber housing a wafer, the chamber including a window, the window including a first main side facing the wafer and a second main side opposite the first main side; and
- a cooling apparatus operable with the chamber, the cooling apparatus for delivering an airflow to the window, wherein the cooling apparatus comprises a support ring supporting the window, and wherein the support ring comprises:
  - a perimeter wall including an interior side and an exterior side;
  - a plurality of slots formed through the perimeter wall, the plurality of slots delivering the airflow across an exterior surface of the window, wherein each of the plurality of slots extends entirely through the perimeter wall, between the interior side and the exterior side; and
  - a shelf including an upper surface in direct physical contact with the second main side of the window, the shelf further including a channel recessed into the upper surface, wherein the channel is enclosed by the second main side of the window, and wherein the channel is operable to transport the gas.

13. The system according to claim 12, the cooling apparatus further comprising:
- a main duct for delivering the airflow to the support ring; and
- an inlet duct coupled to the main duct, wherein the inlet duct is directly physically coupled to support ring, and wherein the inlet duct delivers the airflow towards the plurality of slots of the support ring.

14. The system according to claim 12, further comprising a lamp assembly adjacent the window, the lamp assembly including a lamp for providing light to the wafer.

15. The system according to claim 12, further comprising a fan for delivering the airflow to the cooling apparatus.

16. The system according to claim 12, wherein a first set of slots of the plurality of slots of the support ring is disposed on a first side of the window, wherein a second set of slots of the plurality of slots of the support ring is disposed on a second side of the window, and wherein the airflow travels from the first set of slots towards the second set of slots.

17. The system according to claim 12, further comprising an anti-reflective optical coating on the window.

18. A cooling apparatus operable with a chamber, the cooling apparatus comprising:
- a support ring supporting a window of the chamber, the window including a first main side facing a wafer and a second main side opposite the first main side, and the support ring comprising:
  - a plurality of slots formed through a perimeter wall, the plurality of slots delivering an airflow across the window, wherein the perimeter wall includes an interior side and an exterior side, and wherein each of the plurality of slots extends entirely through the perimeter wall, between the interior side and the exterior side; and
  - a shelf including an upper surface in direct physical contact with the second main side of the window, the shelf further including a channel recessed into the upper surface, wherein the channel is enclosed by the second main side of the window, and wherein the channel is operable to transport the gas; and
- a main duct for delivering the airflow to the support ring.

19. The cooling apparatus according to claim 18, further comprising an inlet duct coupled to the main duct, wherein the inlet duct is directly physically coupled to the support ring, and wherein a housing of the inlet duct defines an opening for delivering the airflow towards the plurality of slots of the support ring.

20. The cooling apparatus according to claim 19, wherein a first set of slots of the plurality of slots of the support ring is disposed on a first side of the window, wherein a second set of slots of the plurality of slots of the support ring is disposed on a second side of the window, wherein a perimeter of the opening of the housing of the inlet duct completely surrounds each of the first set of slots of the plurality of slots, and wherein the airflow travels from the first set of slots towards the second set of slots.

* * * * *